United States Patent [19]

Quenzer et al.

[11] Patent Number: 5,938,911
[45] Date of Patent: Aug. 17, 1999

[54] PROCESS FOR PRODUCING GLASS COATINGS FOR ANODIC BONDING PURPOSES

[75] Inventors: Hans-Joachim Quenzer; Carola Dell, both of Berlin, Germany

[73] Assignee: Fraunhofer-Gesellschaft zur Foerderund der Angewandten Forschung E.V., Munich, Germany

[21] Appl. No.: 08/875,239

[22] PCT Filed: Jan. 17, 1996

[86] PCT No.: PCT/DE96/00103

§ 371 Date: Jul. 18, 1997

§ 102(e) Date: Jul. 18, 1997

[87] PCT Pub. No.: WO96/22256

PCT Pub. Date: Jul. 25, 1996

[30] Foreign Application Priority Data

Jan. 20, 1995 [DE] Germany ............... 195 01 712

[51] Int. Cl.⁶ ............... C03C 29/00; C03B 8/02; C04B 37/00; H01L 21/316
[52] U.S. Cl. ............... 205/114; 65/40; 65/43; 106/287.26; 106/287.34; 156/272.2; 156/273.1; 204/164; 252/309; 252/313.2
[58] Field of Search ............... 205/114; 204/164, 204/157.15; 156/272.2, 273.1; 65/40, 43; 106/287.26, 287.34; 252/309, 313.2

[56] References Cited

U.S. PATENT DOCUMENTS

| | | | |
|---|---|---|---|
| 2,630,410 | 3/1953 | Clapsadle et al. | 252/313 |
| 3,576,652 | 4/1971 | Teicher et al. | 106/38.35 |
| 5,651,921 | 7/1997 | Kaijou | 252/309 |

FOREIGN PATENT DOCUMENTS

| | | |
|---|---|---|
| 0 424 638 | 5/1991 | European Pat. Off. . |
| 2 165 234 | 4/1986 | United Kingdom . |

OTHER PUBLICATIONS

Patent Abstracts of Japan, vol. 16 No. 158 (E–1191), Abstracting JP,A, 04–010418, Apr. 17, 1992.

Chemical Abstracts, vol. 104, No. 24, abstract No. 211890u, Abstracting JP,A, 61–026524, Jun. 16, 1986.

Database WPI, Section Ch, Week, 9401, Derwent Publications Ltd., London, Class E11, AN 94–003416, Abstracting JP,A, 05–315319, Jan. 1994.

*Primary Examiner*—Kathryn Gorgos
*Assistant Examiner*—William T. Leader
*Attorney, Agent, or Firm*—Marshall & Melhorn

[57] ABSTRACT

The invention relates to a method of anodic bonding and a method for producing glass coatings for purposes of anodic bonding and colloidal solutions suitable for this purpose. The method is particularly suitable for anodic bonding with glass coatings with a thickness of greater than 100 nm up to 10 $\mu$m, which are used for connecting two semiconductor layers. In order to produce the required glass coating, an $SiO_2$-sol is dissolved in at least one or in a mixture of n-alkanols (n=1 to 5). Then tetraethyl orthosilicate (TEOS), methyl triethoxysilane (MTEOS) and water are added to this organosol. Furthermore, a small quantity of acid is added to the desired quantity of alkali salts, and the colloidal solution is at least partly polymerized. The colloidal solution thus obtained is suitable for coating conductive materials by cost-effective methods such as immersion, spin-on deposition or spraying and subsequent tempering. After one coating there results a glass coating with a thickness of up to 2 $\mu$m. When the method is repeated a plurality of times, coating thicknesses of over 10 $\mu$m can be obtained.

21 Claims, No Drawings

PROCESS FOR PRODUCING GLASS COATINGS FOR ANODIC BONDING PURPOSES

This is a national stage application of PCT/DE96/00103, filed Jan. 17, 1996.

The invention relates to a method of producing connections between an alkali-containing glass and an electrically conductive material, for example a metal or a semiconductor. Such connections are in particular suitable for connecting the surfaces of two semiconductor elements, for example two silicon wafers with an intermediate alkali-containing glass coating. These methods are used above all in the semiconductor industry.

By anodic bonding is understood a method of producing a connection between alkali-containing glass and electrically conductive material. Anodic bonding is particularly suitable for connecting a semiconductor platelet with a glass layer. In this case, at a temperature of 300° C. to 450° C. an electrical voltage is applied between the ion-conductive alkali-containing glass and the semiconductor, for example silicon. This electrical voltage causes electrochemical reactions at the boundary layer between glass and semiconductor, by means of which the glass is securely connected to the semiconductor. A decisive factor for anodic bonding is substantially the alkali content of the glass coating. The result is a secure undetachable connection between the alkali-containing glass and the semiconductor material.

For anodic bonding of silicon wafers, particularly suitable are boron silicate glasses with a variable content of $B_2O_3$, $SiO_2$ and/or $Al_2O_3$. They are characterised by high chemical strength and by a low coefficient of expansion.

The glass coatings required for anodic bonding are conventionally produced by molecular coating processes such for example as sputtering or vapour deposition or by coating with appropriate colloidal solutions. In the molecular coating processes however, at larger coating thicknesses such as for example required for connecting to silicon wafers, process times of some hours result. In addition the production of such coatings in sputtering or vapour deposition installations always involves the formation of such thick coatings inside the apparatus. These coatings must be removed from time to time, leading to frequent servicing and cleaning operations. Therefore the application of glass coatings by molecular coating processes such as sputtering or vapour deposition are expensive and unprofitable for anodic bonding with glass intermediate layers.

In contrast, glass coatings produced by spin-on deposition of or immersion in appropriate colloidal solutions, are characterised in that the coating process and the apparatus required therefor provide good value. For this purpose sol-gel-coatings on the basis of TEOS (tetraethyl orthosilicate) are normally used. When this coating method is used, however, at the required coating thicknesses for anodic bonding of two semiconductor panels, mechanical stresses occur within the layers which lead to the formation of cracks. Therefore the normally used sol-gel-coatings on the basis of TEOS cannot be used for the production of coating thicknesses which exceed 100 nm.

In summary it can be seen that in order to produce glass coatings for anodic bonding with a thickness between 0.1 and 10 $\mu$m, as are required for example for anodic bonding of two semiconductor plates, molecular application methods such as sputtering or vapour deposition are extremely expensive and involve a high outlay on servicing and cleaning, while the more cost-effective methods in which appropriate colloidal solutions are applied for example by spin-on deposition or immersion, are not suitable for the production of such thick glass coatings. Thus until now there has been no suitable and at the same time cost-effective method of producing alkali-containing glass coatings with a thickness between about 0.1 and about 10 $\mu$m.

It is therefore the object of the invention to make available a simple and cost-effective method for anodic bonding, in which alkali-containing glass coatings with a thickness exceeding 100 nm and can also extend as far as about 10 $\mu$m, are used on an electrically conductive carrier material such for example as semiconductor wafers of silicon. It is a further object of the invention to propose appropriate colloidal solutions which can be used to produce such glass coatings by the method according to the invention.

For the method according to the invention for anodic bonding, the glass coating according to the invention is produced on the electrically conductive material by firstly producing an $SiO_2$-sol in at least one or also in a mixture of a plurality of n-alkanols, n having a value between 1 and 5. There is added to this organosol tetraethyl orthosilicate and/or methyl triethoxysilane. A small quantity of acid and then water and the desired quantity of alkali salts are added, both the acid and the alkali salts being capable of dissolution in an n-alkanol with n=1 to 5. Thereupon this solution is polymerised over a lengthy period. An almost clear opalescent solution is obtained which is extremely suitable for coating. With this solution, in particular high proportions of alkali salts up to the percentage range can be added without the solution precipitating. This colloidal solution according to the invention has a long storage life and can be stored for many hours and then further processed without loss of quality. It is applied to the electrically conductive material to be coated in an otherwise known way, for example by immersion, spin-on deposition or spraying. The coating is dried and cured (tempered) at a temperature which can be selected in accordance with the desired properties of the glass coating. Once this method has been carried out, coating thicknesses of 1 to 2 $\mu$m can be achieved. In order to achieve larger coating thicknesses such for example as 2 to 10 $\mu$m, this method can be repeated a number of times, the newly applied layer in each case having to be dried and tempered between the individual coating steps.

Following the last tempering of the glass coating, the electrically conductive carrier material can be connected (bonded) with the glass coating thus produced by means of application of an electrical current, which flows via the boundary layer between the electrically conductive material and the glass coating.

The method according to the invention is suitable for anodic bonding of the glass coating produced in accordance with the method according to the invention to any electrically conductive material, particularly semiconductor materials such for example as silicon wafers.

As a result of the method according to the invention there is now available a simple and cost-effective method of providing electrically conductive carrier materials with alkali-containing glass coatings, which can reach a thickness of up to 10 $\mu$m, and connecting them therewith. It is particular advantage that, in order to produce the glass coating from a sol, the relatively simple and cost-effective application methods such as spin-on deposition, spraying or immersion can be used for this purpose. The alkali-containing glass coating produced is to a large extent free of cracks and is extremely suitable for anodic bonding. In particular, two coatings of electrically conductive material, such for example as two silicon wafers, can be securely and undetachably connected together by a glass coating produced according to the invention.

A further advantage of the method according to the invention is that the concentration of the alkali ions in the finished glass coating can be adjusted within wide ranges by the addition of differing quantities of alkali salts to the colloidal solution according to the invention.

Advantageous further developments of the method according to the invention and of the colloidal solutions according to the invention are illustrated in the secondary claims.

It has proved advantageous to use as alkali salts sodium compounds, which can be advantageously dissolved in an n-alkanol with n=1 to 5, for example in ethanol and/or methanol. Acetic acid has proved particularly suitable as an acid for addition. This also is advantageously dissolved in an n-alkanol with n=1 to 5, for example in ethanol, before addition to the colloidal solution.

The concentration of the colloidal solution allows the thickness of the finished glass coating to be regulated. Where a thinner glass coating is to be produced in one coating step, the colloidal solution can be diluted before coating with n-alkanols, n lying between 1 and 5. In a similar way, the colloidal solution can be concentrated, so that the coating thickness of the individual coating is increased. The n-alkanol which is the solvent of the colloidal solution is advantageously used for dilution.

The properties of the finished glass coating are greatly influenced by the temperature at which the applied and dried colloidal solution is tempered. If tempering is carried out at a temperature beneath 400° C., a large proportion of organic material, for example in the form of methyl groups, remains in the finished glass. Consequently, the finished glass involves organically modified silicates with additional alkali ions.

If the glass coating is tempered at temperatures above 450° C. for example in air or oxygen, the glass coating is practically totally condensed.

If tempering is carried out at temperatures above 650° C., an extremely dense glass coating results, which has an $Na_2O$-content, which can be extremely precisely predetermined by the addition of corresponding quantities of alkali salts to the colloidal solution. Such dense glass coatings are characterised by extremely high tensile strength, and are themselves resistant to alkaline etching.

Irrespective of the temperature at which the glass coating has been tempered, and irrespective of the number and/or sequence of tempering phases, all the glass coatings produced by the method according to the invention bond extremely well.

Improvements to or alterations in the properties of the glass coating produced according to the invention can be achieved by the addition of further chemical compounds to the colloidal solution according to the invention. For example, in order to improve the chemical strength and in order to adapt the coefficient of expansion of the glass coating to the materials to be bonded, boron compounds such as boric acid and/or organic aluminium compounds can be added, without impairing the functional properties of the finished glass coating important for anodic bonding.

Some particularly preferred and particularly simple embodiments of the invention given by way of example will be shown in the following, without restricting the scope of the invention to these embodiments given by way of example.

EXAMPLE 1

Starting with an aqueous solution of silicon dioxide particles with an average diameter of 7 nm, an ethanolic alcohol sol was produced. 35.6 g of methyl triethoxysilane and 11.5 g tetraethyl orthosilicate triethoxysilane and 11.5 g of tetraethyl orthosilicate were added to 50 g of this alcohol sol, the pH value of which was 2. Then 10 g water and 16 g 10% sodium acetate solution in methanol were added with constant stirring. This mixture was then tempered for 36 to 38 hours at 22° C.

After termination of the reaction an almost clear but opalescent solution is obtained, which is suitable for coating by immersion, spin-on deposition or spraying. After coating a silicon carrier material with this solution, the coating was dried and finally tempered at a temperature beneath 400° C.

A glass coating was obtained which contained a relatively high proportion of organic material (methyl groups). This material produced was extremely suitable for anodic bonding and, after bonding effected in the previous way by an electrical current, resulted in a secure bond between the silicon carrier material and the glass coating.

EXAMPLE 2

A glass coating was produced as in Example 1 and then tempered at temperatures above 450° C. This led to a further condensation of the glass coating.

EXAMPLE 3

A glass coating was produced as in Example 2 and then tempered at above 650° C. An extremely dense glass coating resulted. This coating had particularly high tensile strength and proved resistant against alkaline etching by a 25% tetramethyl ammonium hydroxide solution. Such tetramethyl ammonium hydroxide solutions are in particular used in the manufacture of micromechanical components. The glass coating produced in this example is therefore particularly suitable for use in industrial production of such components.

We claim:

1. A method for anodic bonding of an alkali-containing glass to an electrically conductive material comprising
   (a) providing a colloidal solution obtained by:
      producing a $SiO_2$-sol in one or in a mixture of n-alkanols, n having a value between 1 and 5;
         adding at least one chemical compound selected from the group consisting of TEOS (tetraethyl orthosilicate) and MTEOS (methyl triethoxysilane) and an acid to the colloidal solution;
         adding water and alkali salts to the colloidal solution; and
         at least partly polymerising the colloidal solution;
   (b) applying the colloidal solution onto an electrically conductive material to form an alkali-containing glass coating on said electrically conductive material;
   (c) drying and tempering said alkali-containing glass coating; and
   (d) applying an electrical current across a boundary between the electrically conductive material and the alkali-containing glass coating to anodically bond the electrically conductive material to the alkali-containing glass coating.

2. The method according to claim 1, wherein the alkali salts are sodium compounds.

3. The method according to claim 1, wherein the colloidal solution to be applied to the electrically conductive material is concentrated or diluted with n-alkanols, n having a value between 1 and 5, in order to alter the thickness of the coating.

4. The method according to claim 3, wherein the n-alkanol is ethanol.

5. The method according to claim 1, wherein the acid is acetic acid.

6. The method according to claim 1, wherein at least one of the alkali salts and the acid is diluted before addition to the colloidal solution in one or in a mixture of a plurality of n-alkanols, n having a value between 1 and 5.

7. The method according to claim 6, wherein the n-alkanol is ethanol.

8. The method according to claim 1, wherein the colloidal solution applied to the electrically conductive material is tempered at temperatures up to 400° C.

9. The method according to claim 1, wherein the colloidal solution applied to the electrically conductive material is tempered at temperatures above 450° C. in air or oxygen.

10. The method according to claim 1, wherein the colloidal solution applied to the electrically conductive material is tempered at temperatures above 650° C.

11. The method according to claim 1, wherein properties of the alkali-containing glass are altered in a controlled manner by the addition of boric acid or of organic aluminum compounds.

12. The method according to claim 1, wherein the properties of said alkali-containing glass are altered in a controlled manner by the addition of chemical compounds selected from the group consisting of boric acid, boron compounds other than boric acid, and organic aluminum compounds.

13. The method according to claim 1, wherein the colloidal solution is applied to a first electrically conductive material, a second electrically conductive material is disposed on the first electrically conductive material such that the alkali-containing glass will be sandwiched between the first and the second electrically conductive material, and the electrical current is applied across a boundary between the first electrically conductive material and the alkali-containing glass and a boundary between the second electrically conductive material and the alkali-containing glass.

14. A colloidal solution for producing glass coatings suitable for anodic bonding to electrically conductive materials, the colloidal solution being at least partly polymerized and comprising:

a $SiO_2$-sol in one or in a mixture of n-alkanols, n having a value between 1 and 5;

a mixture of TEOS (tetraethyl orthosilicate) and MTEOS (methyl triethoxysilane); and an acid, water and alkali salts.

15. The colloidal solution according to claim 14, wherein the alkali salts are sodium compounds.

16. The colloidal solution according to claim 14, wherein at least one of the alkali salts and the acid is added dissolved in one or in a mixture of a plurality of n-alkanols, n having a value between 1 and 5.

17. The colloidal solution according to claim 16, wherein the one or the mixture of a plurality of n-alkanols is selected from the group consisting of ethanol and methanol.

18. The colloidal solution according to claim 14, wherein the acid is acetic acid.

19. The colloidal solution according to claim 14, wherein the colloidal solution contains boric acid or organic aluminum compounds.

20. The colloidal solution according to claim 14, further including chemical compounds selected from the group consisting of boric acid, boron compounds other than boric acid, and organic aluminum compounds.

21. The colloidal solution according to claim 14, wherein the mass ratio of the mixture of TEOS and MTEOS is about 1:3.

* * * * *